US012185474B2

(12) United States Patent
Van Den Brand et al.

(10) Patent No.: US 12,185,474 B2
(45) Date of Patent: Dec. 31, 2024

(54) ELECTRONIC DEVICE WITH MULTILAYER LAMINATE

(71) Applicant: Nederlandse Organisatie voor toegepast-natuurwetenschappelijk onderzoek TNO, 's-Gravenhage (NL)

(72) Inventors: Jeroen Van Den Brand, Goirle (NL); Stephan Harkema, Hilversum (NL); Margaretha Maria De Kok, Eindhoven (NL); Adri Van Der Waal, Zaltbommel (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 162 days.

(21) Appl. No.: 17/637,257

(22) PCT Filed: Aug. 28, 2020

(86) PCT No.: PCT/NL2020/050533
§ 371 (c)(1),
(2) Date: Feb. 22, 2022

(87) PCT Pub. No.: WO2021/040524
PCT Pub. Date: Mar. 4, 2021

(65) Prior Publication Data
US 2022/0287186 A1 Sep. 8, 2022

(30) Foreign Application Priority Data

Aug. 30, 2019 (EP) ..................................... 19194775

(51) Int. Cl.
*H05K 3/00* (2006.01)
*H05K 1/02* (2006.01)
*H05K 3/28* (2006.01)

(52) U.S. Cl.
CPC ........... *H05K 3/284* (2013.01); *H05K 1/0274* (2013.01); *H05K 1/0284* (2013.01);
(Continued)

(58) Field of Classification Search
CPC .... H05K 3/284; H05K 1/0274; H05K 1/0284; H05K 3/0014; H05K 2201/09018;
(Continued)

(56) References Cited

U.S. PATENT DOCUMENTS 10,288,800 B1 * 5/2019 Keränen .............. H05K 1/0274
2008/0067526 A1 * 3/2008 Chew ..................... H05K 1/189
438/24

(Continued)

FOREIGN PATENT DOCUMENTS

CN 107432094 A 12/2017
CN 107709007 A 2/2018
(Continued)

OTHER PUBLICATIONS

European Patent Office, International Search Report in corresponding International Application No. PCT/NL2020/050533, dated Nov. 20, 2020 (2 pages).
(Continued)

*Primary Examiner* — Pete T Lee
(74) *Attorney, Agent, or Firm* — Leydig, Voit & Mayer, Ltd.

(57) ABSTRACT

An electronic device (100) comprises an electronics substrate (10) with at least one light emitting device (12), a cover substrate (20) with a graphical pattern including at least one window (22), and a thermoplastic layer (30) there between. A multilayer laminate (40) of the device (100) is formed by combining the electronics substrate (10) and the cover substrate (20) by lamination with protruding electronic components (11,12) facing the thermoplastic layer (Continued)

(30). At least the thermoplastic layer (30) is heated to a lamination temperature (T1) for increasing a plasticity of the thermoplastic material (30m). The electronic components (11,12) are pushed by the lamination into the heated thermoplastic layer (30) for embedding the electronic components (11,12) in the thermoplastic material (30m).

20 Claims, 4 Drawing Sheets

(52) U.S. Cl.
CPC . *H05K 3/0014* (2013.01); *H05K 2201/09018* (2013.01); *H05K 2201/10106* (2013.01); *H05K 2203/1316* (2013.01); *H05K 2203/1327* (2013.01)

(58) Field of Classification Search
CPC . H05K 2201/10106; H05K 2203/1316; H05K 2203/1327
See application file for complete search history.

(56) References Cited

U.S. PATENT DOCUMENTS

| | | | | |
|---|---|---|---|---|
| 2016/0029481 | A1* | 1/2016 | Augoustidis | H05K 1/056 313/46 |
| 2018/0310403 | A1* | 10/2018 | Albertson | H05K 1/112 |
| 2019/0008064 | A1* | 1/2019 | Kajisa | H05K 13/00 |
| 2019/0132959 | A1* | 5/2019 | Reiderman | H05K 7/2039 |
| 2021/0368627 | A1 | 11/2021 | Smits et al. | |
| 2022/0171121 | A1* | 6/2022 | Keränen | G02B 6/0031 |

FOREIGN PATENT DOCUMENTS

| | | | |
|---|---|---|---|
| CN | 111727667 A | 9/2020 | |
| CN | 113015929 A | 6/2021 | |
| CN | 115327691 A | 11/2022 | |
| CN | 115951443 A | 4/2023 | |
| EP | 3255479 A1 | 12/2017 | |
| EP | 3528602 A1 * | 8/2019 | H05K 1/0393 |
| EP | 4283351 A2 | 11/2023 | |
| JP | 2013157408 A | 8/2013 | |
| JP | 2014222721 A | 11/2014 | |
| JP | 2018124743 A | 8/2018 | |
| JP | 2019514178 A | 5/2019 | |
| JP | 2021514114 A | 6/2021 | |
| JP | 2022508298 A | 1/2022 | |
| JP | 2022122891 A | 8/2022 | |
| JP | 2003188198 A | 7/2023 | |
| KR | 1020210073588 A | 6/2021 | |
| KR | 1020220044224 A | 4/2022 | |
| WO | 2004009345 A1 | 1/2004 | |
| WO | 2017115712 A1 | 7/2017 | |
| WO | 2019160417 A1 | 8/2019 | |
| WO | 2020115370 A1 | 6/2020 | |

OTHER PUBLICATIONS

Japanese Patent Office, Examination Report in corresponding Japanese Application No. 2022-512881 dated Jul. 19, 2024.

* cited by examiner

ELECTRONIC DEVICE WITH MULTILAYER LAMINATE

CROSS-REFERENCE TO RELATED APPLICATIONS

This patent application is a U.S. National Phase of PCT International Application No. PCT/NL2020/050533, filed Aug. 28, 2020, which claims priority to European Application No. 19194775.3, filed Aug. 30, 2019, which are both expressly incorporated by reference in their entireties, including any references contained therein.

TECHNICAL FIELD AND BACKGROUND

The present disclosure relates to multilayer electronic devices and methods of manufacturing.

Electronic devices can generally comprise multiple layers of electronic components, graphical components, conductive materials, circuits, et cetera. Typically, the manufacturing of electronic devices comprises a multi-step sequence of processes during which the layers are gradually formed on a substrate and over-molded by plastics to form a multilayer structure with embedded electronics. For example by thermoforming, injection molding, blow molding, rotational molding, etcetera. Accordingly, the electronics are sealed and protected from the environment.

For example, in-mold electronic devices can be made by backside injection molding a thermoformed film. However, including both electronics and graphics in a thermoformable and/or injection moldable product typically needs careful selection of materials and processing. The wrong choice or approach can result in optical defects that reveal the circuitry and components to the user. One solution to the problem is to use thicker substrates. However, this leads to higher costs as thicker substrates are significantly more expensive. Moreover, injection molding locally applies high sheer stresses to components that stick out of the otherwise flat surface. Such components can detach as a result of these forces, leading to yield losses. Components with a perpendicular orientation with respect to the material flow are most susceptible to sheer. Stronger glues (underfill) may help, but may need a separate manual application step and may induce other issues regarding contacting of components. Segmentation of the molded layer is another major issue with backside injection molding, due to the necessity of one mold per material. For example, segmentation can be used in order to create light guides that do not exhibit optical cross talk. Separate islands of the same material needs to be linked in order to have these filled by molding, otherwise each island may need its own mold. Local light guides are therefore tricky to make by molding. Finally, accessing the electrical circuitry using a rigid or flex connector is challenging when backside injection molding is used. Such a connector is formed e.g. by applying a laser through a specific part of the plastic part, or by creating a flex contact that sticks out from the mold. During molding, however, stresses peak at the transition from molded part and connector, making it susceptible to failure. This can be partially avoided using, e.g., copper/polyimide flex contacts; but these may be relatively expensive. There remains a need for further improvements in manufacturing multi-layer electronic devices.

SUMMARY

Aspects of the present disclosure relate to methods of manufacturing an electronic device and relating products, e.g. obtained by such methods. As described herein, the method comprises combining various substrates, e.g. having electronic and/or graphical layers, in a multilayer laminate. For example, an electronics substrate typically comprises electronic components disposed on and protruding from at least one side of the electronics substrate.

In some embodiments, the electronic components comprise at least one light emitting device for emitting light. In this way, the electronics substrate can, e.g. provide backlighting for other or further layers. In some embodiments, a cover substrate is used having a graphical pattern. For example, the graphical pattern comprises one or more layers of (opaque) material. The graphical pattern may comprise one or more regions for transmitting at least, part of the emitted light from a respective light emitting device.

In some embodiments, an electronics substrate and cover substrate can be manufactured with separate functionalities thereby avoiding the interference of materials that occurs when building on one film. Preferably, a thermoplastic layer is provided between the electronics substrate and the cover substrate. For example, the thermoplastic layer comprises a thermoplastic material capable of transmitting light. Most preferably, the backlighting passes from the electronics substrate through the thermoplastic layer through the window in the cover substrate reaching the user.

Advantageously, a multilayer laminate can be formed by combining the electronics substrate and the cover substrate by lamination of the thermoplastic layer with the protruding electronic components facing the thermoplastic layer. By heating at least the thermoplastic layer to a lamination temperature for increasing a plasticity of the thermoplastic material, the electronic components may be more easily pushed by lamination into the heated thermoplastic layer for embedding the electronic components in the thermoplastic material. It will be appreciated that this way the electronics substrate and the cover substrate can be split between the two sides of the laminate. In addition, the forming of a multilayer laminate may avoid performing several sequential forming steps and multi-film alignment in a mold.

Optionally, the multilayer laminate may be thermoformed into a desired, e.g. three-dimensional shape. Alternatively, or additionally, the laminate may optionally be further reinforced by (back) injection molding, or otherwise over-molded. By first laminating the layers using a thermoplastic layer, the components, electronic circuitry, and or graphical layers can be protected from the further processing, e.g. mitigating risks of shear forces in thermoforming and injection molding.

In some embodiments, the thermoplastic layer comprises a structured set of properties like mechanical stiffness, optical properties like absorbing, light guiding, blocking, reflecting light, or other electronic or thermal properties. Accordingly, as the laminate is constructed out of three films, differentiation in these properties can be defined in the thermoplastic layer before lamination.

BRIEF DESCRIPTION OF DRAWINGS

These and other features, aspects, and advantages of the apparatus, systems and methods of the present disclosure will become better understood from the following description, appended claims, and accompanying drawing wherein:

DESCRIPTION OF EMBODIMENTS

Figure 1A:
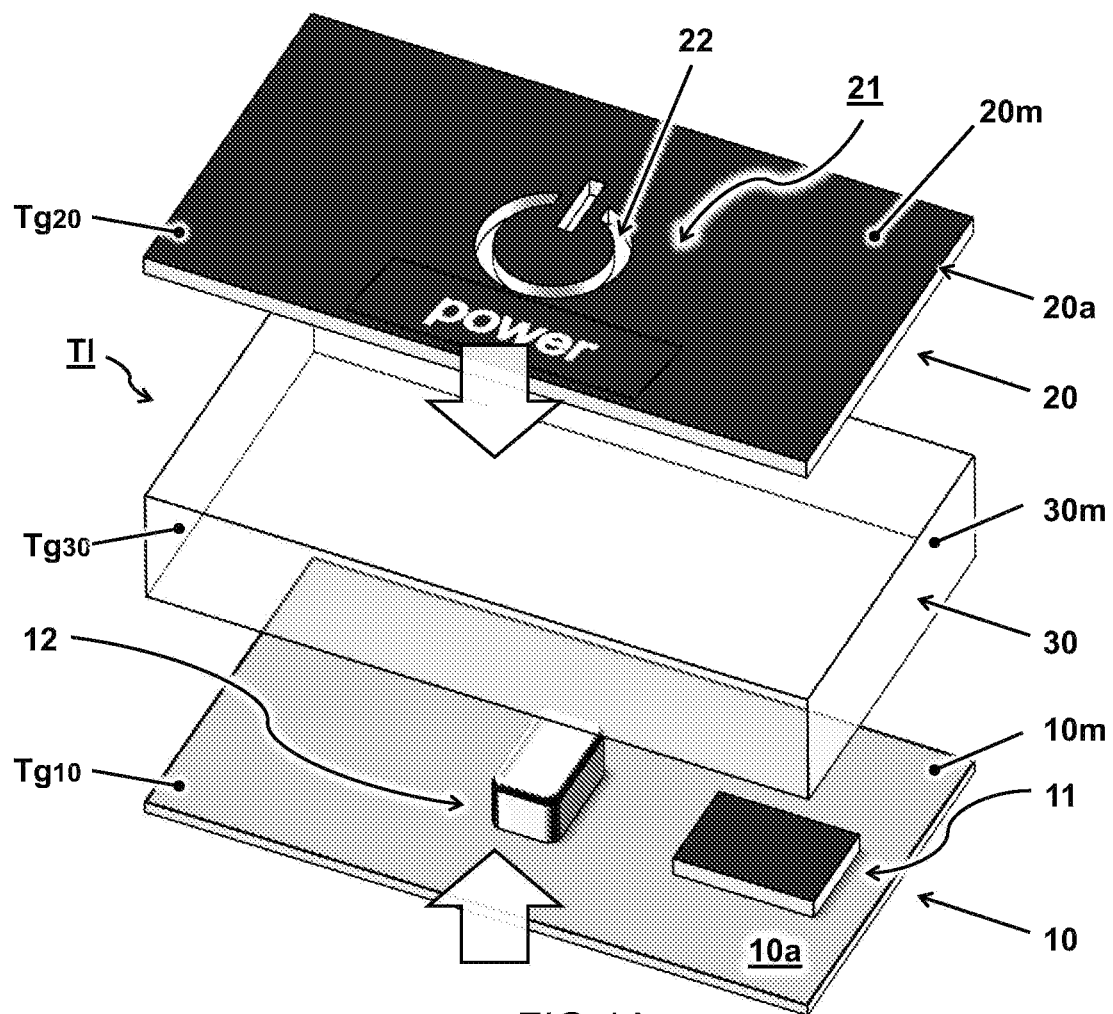
FIG. 1A illustrates manufacturing an electronic device.

Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features. It will be further understood that when a particular step of a method is referred to as subsequent to another step, it can directly follow said other step or one or more intermediate steps may be carried out before carrying out, the particular step, unless specified otherwise. Likewise it will be understood that when a connection between structures or components is described, this connection may be established directly or through intermediate structures or components unless specified otherwise.

Aspects of the present disclosure comprise a multilayer laminate wherein the electronics and graphics substrates are split between the two sides of the laminate. Typically, an elastomer is disposed between the two substrates to form a single segmented layer with patches/islands with different (optical) properties. For example, through the choice of material and three-dimensional shape, a stiffness is achieved rendering backside injection molding unnecessary. Advantageously, components for light management, sensing, actuation and operation of the device are embedded in the elastomeric layer that sufficiently flows during thermoforming to avoid stresses at the components in any orientation. Additionally, easy external contact of the printed electronics in a cheap and straightforward fashion is possible. In some embodiments, the graphics are printed on a relatively thin film, and on another film the electronic functionality is applied. For example, patterned conductors and dielectrics, and components are assembled potentially in multilayer. It will be appreciated that both films can be separately manufactured and printed with materials that serve in the optical management light reflecting, blocking or absorbing.

In some embodiments, two or more films are combined into a laminate, having the printed materials facing towards each other by lamination of the third elastomer layer to embed the components at temperatures above its processing temperature. In other or further embodiments, the elastomer layer can be segmented, comprising an alternation of translucent, opaque, colored and colorless transparent materials. It may be envisioned that due to the stiffness of the elastomer and the choice of external layers, the device has a sufficiently high stiffness and stability without the need for further processing, e.g. back injection molding.

The invention is described more fully hereinafter with reference to the accompanying drawings, in which embodiments of the invention are shown. In the drawings, the absolute and relative sizes of systems, components, layers, and regions may be exaggerated for clarity. Embodiments may be described with reference to schematic and/or cross-section illustrations of possibly idealized embodiments and intermediate structures of the invention. In the description and drawings, like numbers refer to like elements throughout. Relative terms as well as derivatives thereof should be construed to refer to the orientation as then described or as shown in the drawing under discussion. These relative terms are for convenience of description and do not require that the system be constructed or operated in a particular orientation unless stated otherwise.

Figure 1B:
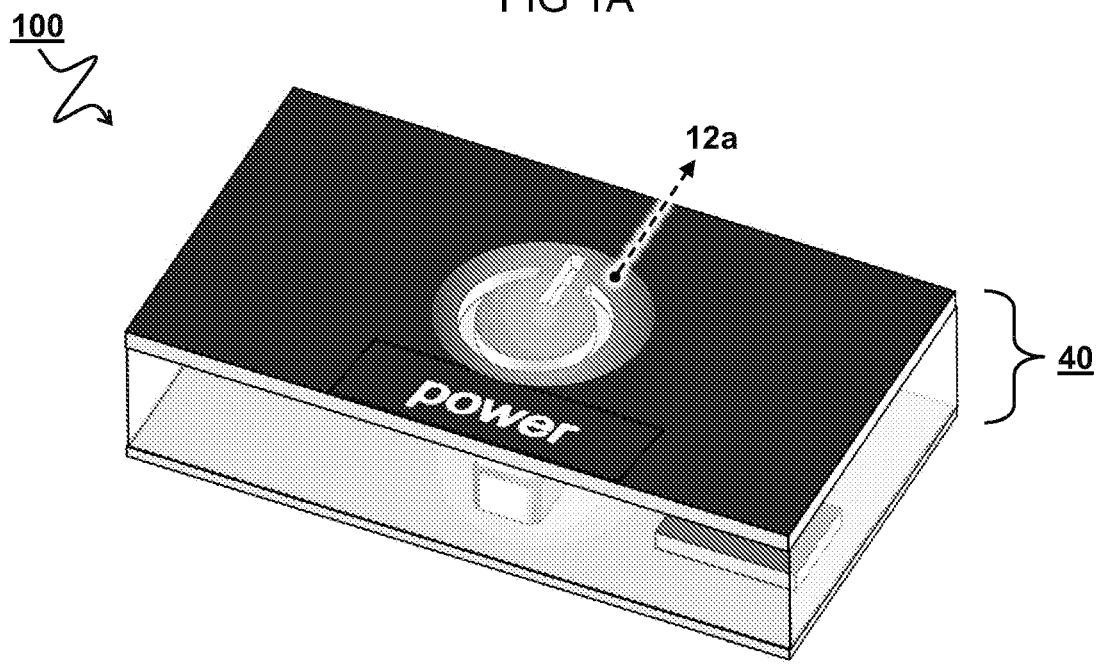
FIG. 1B illustrates an electronic device.

FIG. 1A illustrates manufacturing an electronic device 100; FIG. 1B illustrates an electronic device, e.g. resulting from such method.

In some embodiments, the method comprises providing an electronics substrate 10. For example, as shown, the electronics substrate 10 comprises electronic components 11,12 disposed on and protruding from at least one side 10a of the electronics substrate 10. In some preferred embodiments, the electronic components 11,12 comprise at least one light emitting device 12. For example, the light emitting device 12 can be configured to emit light 12a, e.g. visible light. In other or further embodiments, a cover substrate 20 can be provided, e.g. comprising a graphical pattern 21. For example, the graphical pattern 21 can be formed by one or more layers 20a of material. The materials may include opaque material stack 20m to reflect or block at least part of the emitted or other light in specific regions of the cover substrate 20. Also other or further materials can be used having varying degrees of opaqueness/transparency. Preferably, the graphical pattern 21 comprising at least one window 22 for transmitting at least part of the emitted light 12a from a respective light emitting device 12.

In some embodiments, a thermoplastic layer 30 is provided between the electronics substrate 10 and the cover substrate 20. Preferably, the thermoplastic layer 30 comprises at least some regions with a thermoplastic material 30m for transmitting at least part of the emitted light 12a through at least part of the thermoplastic layer 30.

In some embodiments, a multilayer laminate 40 is formed by combining the electronics substrate 10 and the cover substrate 20 by lamination. Preferably, the electronics substrate 10 is arranged with the protruding electronic components 11,12 facing the intermediate thermoplastic layer 30. Most preferably, at least the thermoplastic layer 30 is heated to an elevated temperature, e.g. at least above room temperature (300K). For example, the thermoplastic material 30m is heated to a lamination temperature T1. This may cause an increase of a plasticity of the thermoplastic material 30m. In some embodiments, the electronic components 11,12 are pushed by the lamination into the heated thermoplastic layer 30 for embedding the electronic components 11,12 in the thermoplastic material 30m.

Typically, one or more electronic devices can be disposed on an electronics substrate 10, e.g. forming a back plate. For example, the electronics substrate 10 can provide electronic functionality to the electronic device 100. For example, the functionality may include one or more of lighting, sensing, actuating, or any other operation or interaction of the device. For example, the electronic components may include electromechanical components, electro-optical components, integrated circuits chips, radiation emitting components, phototransistors, photovoltaic devices, et cetera. In a preferred embodiment, e.g. as shown, the electronics substrate 10 comprises at least one component or device 12 with light emitting properties such as a light-emitting diode LED, e.g. to provide backlighting to the electronic device 100. Also other (non-light emitting) devices such a integrated circuitry (chips), et cetera may be present, as illustrated in the figure.

The electronics substrate 10 may comprise various materials 10m, e.g. printed electronics, patterned conductors, dielectrics, transistors, electric circuits, on one or both sides of the electronics substrate 10*a*. Also other materials 10*m* can be printed on the electronics substrate 10, e.g. for providing optical function, such as light reflecting, blocking and/or absorbing materials. In a preferred embodiment, the electronics substrate 10 is formed as a thin film. For example, the electronics substrate 10 is a Polycarbonate (PC) thin film with relatively low thickness of less than one millimeter, preferably between ten and thousand microns, more preferably between fifty and five hundred microns, for example hundred microns.

In some embodiments, the cover substrate 20 as described herein can form a front plate of a user interface. For example, the cover substrate 20 can provide graphical and visual functionality to the electronic device 100 which may, for example, include optical transmittance, blocking of light, providing text, patterns, color or protection. In a preferred embodiment, e.g. as shown, the cover substrate 20 comprises a graphical pattern 21 formed by one or more layers 20*a* of opaque material 20*m* to obscure or conceal at least part of the electronic device 100 from a user, as well as to reflect light within the light guide. For example, the graphical layers are disposed on a (support) substrate or film which can be of the same or different material as the electronics substrate. In some embodiments, the cover substrate 20 may include layers or segment layers 20*a* of graphical or functional ink which may be black or white ink, or any other color. In other or further embodiments, the functional patterns may include cover layers to block light. In other or further embodiments, the cover substrate 20 may include protective layers, for example anti-scratch, abrasion resistance or UV protection layers.

In a preferred embodiment, the cover substrate 20 is formed by multiple layers, e.g. wherein the visual features such as patterns or coloring may be provided via internal or external layers. In some embodiments, at least some of the graphical layers are disposed on a side facing the thermoplastic layer 30 so that the features remain isolated and thus protected from environmental effects at least by the thickness of the film. Accordingly, different impacts, rubbing, chemicals, etc. that could easily damage e.g. painted surface features, do not reach these layers.

In another or further preferred embodiment, the graphical pattern 21 comprises at least one window 22 for transmitting at least part of the emitted light 12*a* from a respective light emitting device 12. The at least one window 22 is for allowing backlighting to pass through the cover substrate 20 to the user. In some embodiments, the graphical pattern 21 is configured to block a view of the electronics substrate 10 underneath and/or block light emitted e.g. from the light emitting device 12 through parts of the cover substrate 20 other than the window 22. For example, a thickness, absorption and/or (back) reflection of the cover substrate 20 and/or the opaque material 20*m* is configured to allow less than ninety, ninety-five, or even less than ninety-nine percent of the emitted light 12*a* through the opaque regions.

In a preferred embodiment, the cover substrate 20 is formed by a thin film. For example, the cover substrate 20 is a PC thin film with relatively low thickness of less than one millimeter, preferably between hundred and thousand microns, more preferably between two hundred and five hundred microns, for example three hundred microns.

In some embodiments, one or both of the electronics substrate 10 and/or cover substrate 20 may include printed materials. Printing can be understood as a process for transferring material, e.g. ink or other liquid, onto a target substrate, e.g. to form predetermined shapes. As described herein, the printed materials may include conductive materials, e.g. conductive ink, capable of forming electrical connections, and/or colored materials for producing graphical elements from the printed matter. Printing techniques may including e.g. screen printing, flexography, and inkjet printing. Of course also other methods of depositing materials can be used to apply layers, circuits, and/or components, e.g. laminating, lithography, pick-and-place, et cetera.

Typically, a thermoplastic, or thermos-softening material, is a plastic polymer material that becomes pliable or moldable at a certain elevated temperature and solidifies upon cooling. Thermoplastics differ from thermosetting polymers which form irreversible chemical bonds during the curing process. Above its glass transition temperature (Tg) and below its melting point, the physical properties of a thermoplastic change drastically without an associated phase change. Some thermoplastics do not fully crystallize below the glass transition temperature, retaining some or all of their amorphous characteristics. For example, amorphous and semi-amorphous plastics are preferred in some embodiments to provide high optical clarity.

In a preferred embodiment, the thermoplastic layer, as described herein, may include elastomers chosen from a family of stiff polyurethanes such as Thermoplastic Polyurethane TPU or Polyvinyl Butyral PVB. For example, the thermoplastic layer 30 has a relatively low thickness of one millimeter or less, preferably between two hundred and thousand microns, more preferably between four hundred and eight hundred microns, for example five hundred microns, but at least the height of the highest component embedded within this layer.

In a preferred embodiment, the electronics substrate 10, cover substrate 20 and thermoplastic layer 30 are separately processed. Each material may be configured depending on functional properties and features of the electronic device 100. In another or further preferred embodiment, the cover substrate 20 and the electronics substrate 10 are subsequently combined into a multilayer laminate 40 by lamination of the thermoplastic layer 30 there between to form a total stack, e.g. as shown. In some embodiments, the electronics and or cover substrates 10,20 may also comprise thermoplastic material.

In physics and materials science, plasticity generally describes deformation of a (solid) material undergoing non-reversible changes of shape in response to applied forces, e.g. as opposed to elastic deformation. In the present context, the thermoplastic material 30*m* can be deformed by the electronic components 11,12 being pushed into the thermoplastic layer 30. By increasing the plasticity of the thermoplastic material 30*m* it may be relatively easy to deform the material allowing the electronic components 11,12 to be pushed into the thermoplastic layer 30. For example, the plasticity can be increased (i.e. the material becomes more pliable or moldable) by heating the material to a lamination temperature T1 which is preferably close to or above its glass transition temperature.

Glass transition is generally understood as the gradual and reversible transition in amorphous materials or in amorphous regions within semi-crystalline materials, from a hard and relatively brittle "glassy" state into a viscous or rubbery state as the temperature is increased. Typically, the glass-transition temperature (Tg) of a material may characterize a small range of temperatures over which this glass transition occurs. Depending on the material, the difference in stiffness below and above Tg can be several orders of magnitude. While different definitions of Tg may vary by a few degrees Celsius Kelvin it will be qualitatively clear that the material can be substantially more malleable once a critical threshold in the range over which the glass transition occurs has been crossed. To resolve ambiguity of relative temperatures as used herein the glass transition temperature can be defined with reference to the viscosity, fixing Tg at a value of $10^{13}$ poise or $10^{12}$ Pa·s.

In a preferred embodiment, the lamination temperature T1 is above a glass transition temperature Tg30 of the thermoplastic material 30m and below a glass transition temperature Tg10,Tg20 of the electronics and/or cover substrates 10,20. For example, the lamination temperature T1 is at least one, two, three, or five degree Celsius above the glass transition temperature Tg30 of the thermoplastic material 30m and/or at least one, two, three, or five degree Celsius below the glass transition temperature Tg10 or Tg20 of the electronics and/or cover substrates 10,20 (which may or may not be the same material). Advantageously, this may allow setting a first processing temperature, i.e. lamination temperature T1, where the thermoplastic layer 30 becomes relatively soft while the electronics and/or cover substrates 10,20 are still relatively firm. For example, at the first processing temperature, the electronic components 11,12 can be pushed into the thermoplastic layer 30, so the components are at least partially sunken or embedded into the thermoplastic material 30m.

As will be understood, by pushing the electronic components 11,12 into the thermoplastic layer 30, the electronic components 11,12 can push away some of the thermoplastic material 30m in that layer, which thermoplastic material 30m is softened by the elevated temperature of the thermoplastic layer 30, so the electronic components 11,12 can sink into and become tightly embedded, i.e. enveloped or engulfed in the thermoplastic material 30m. By the thermoplastic material surrounding and contacting e.g. the light emitting device 12, a suitable connection for guiding the emitted light 12a may be formed.

Preferably, the glass transition temperature of the thermoplastic layer 30 is lower than that of the electronics and/or cover substrates 10,20 by at least ten degrees Celsius, preferably at least twenty degrees, or at least thirty degrees, or more. The lower the glass transition temperature of the thermoplastic layer 30, e.g. compared to that of at least the electronics substrate 10, the better the components can be pushed into the thermoplastic layer 30 without affecting a shape of the electronics substrate 10, anchor the less the stress applied on the electronic components 11,12. On the other hand, preferably the glass transition temperature of the thermoplastic layer 30 is relatively high to prevent spontaneous softening during normal use of the device, e.g. having a glass transition temperature above eighty degrees Celsius, preferably above hundred degrees Celsius, or more. Other or further important aspects may relate to stiffness or hardness of the materials. For example, it may be preferably to use substrates or layers having a ShoreA hardness of more than fifty, more than eighty, or even more than hundred.

In some embodiments, the multilayer laminate 40 is formed as a sheet with relatively low thickness, e.g. three millimeters or less, preferably between half a millimeter and one-and-half millimeters, more preferably between eight hundred microns and one millimeter, for example nine hundred microns. Preferably, the thickness is at least equal to that of the highest component. In some embodiments, the multilayer laminate 40 forms the electronic device as an end user product. In other or further embodiments, the multilayer laminate 40 forms part of other or further parts or devices.

Other or further aspects can be embodied as an electronic device 100, e.g. manufactured by the methods described herein or otherwise. For example, as shown, the electronic device 100 may comprise one or more of the electronics substrate 10, a cover substrate 20, and thermoplastic layer 30 there between. Also other or further layers can be provided, e.g. multiple electronic substrates (not show). The layers may form a multilayer laminate 40 formed by combining the electronics substrate 10 and the cover substrate 20 by lamination at an elevated lamination temperature 11 to temporarily increase a plasticity of the thermoplastic material 30m, with the protruding electronic components 11,12 facing the thermoplastic layer 30 there between. Accordingly, the electronic components 11,12 are embedded in the thermoplastic material 30m. In some embodiments, as will be described in the following, the multilayer laminate 40 can have an out-of-plane shape. In other or further embodiments, the electronics substrate 10 is arranged between the thermoplastic material 30m and an injection molded thermosetting material 60m.

Figure 2A:
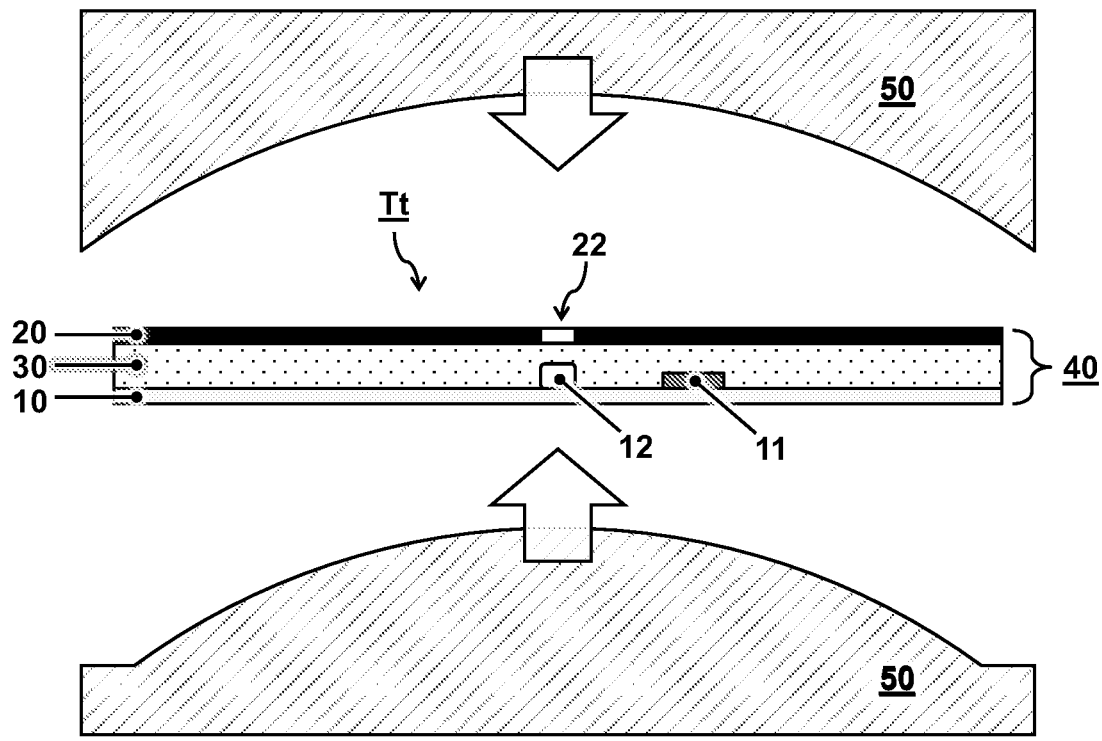
FIG. 2A illustrates an cross-section view of thermoforming the multilayer laminate.
Figure 2B:
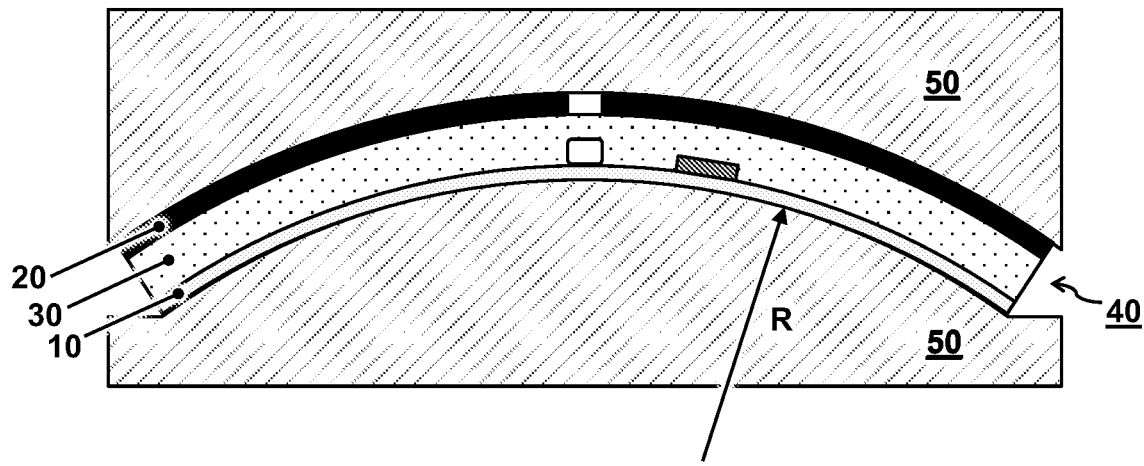
FIG. 2B shows the multilayer laminate inside the thermoforming mold.

FIG. 2A illustrates an cross-section view of thermoforming the multilayer laminate 40 and FIG. 2B shows the multilayer laminate 40 inside the thermoforming mold 50.

In some embodiments, e.g. as shown, the multilayer laminate 40 is further processed by a shape deformation process. Preferably, the deformation process comprises thermoforming. For example, the deformation process comprises applying a predefined macroscopic shape to the multilayer laminate 40 for thermoforming the stack. Thermoforming is generally understood as a manufacturing process where a substrate of a thermoplastic (thermosoftening plastic) material is heated to a pliable forming temperature. Typically, above a glass transition temperature of the material, and below its melting point, the physical properties of a thermoplastic change drastically without an associated phase change. The heated substrate can be formed to a specific shape e.g. using a mold, and optionally trimmed to create a usable product. Typically, the substrate, e.g. sheet or film, is heated to a relatively high temperature to permit stretching into or onto a mold and cooled to a finished shape.

In some embodiments, the electronics substrate 10, cover substrate 20, and thermoplastic layer 30 are laminated to initially form a planar multilayer laminate 40. Preferably, the planar multilayer laminate 40 is deformed out-of-plane by a subsequent thermoforming process. Most preferably, the multilayer laminate 40 is processed by a single thermoforming step into a final three-dimensional form of the electronic device 100. For example, a specific shape of mold 50 is used to produce a final shape.

In one embodiment, the multilayer laminate 40 is heated in a thermoforming process to a thermoforming temperature (Tt), e.g. close to or above a glass transition temperature (Tg) of the electronics and/or cover substrates 10,20. (i.e. also above the Tg of the thermoplastic layer 30), to permit the layers to be deformed according to a shape of the mold 50. The multilayer laminate 40 may subsequently be cooled to retain its final shape. Preferably, the thermoplastic layer 30 is sufficiently mobile at the thermoforming temperature to alleviate (lateral) stresses on the electronic components 11,12. For example, the multilayer laminate 40 may be deformed along one or more out-of-plane directions having a respective radius of curvature R. For example, the radius of curvature R in at least some parts of the thermoformed multilayer laminate 40 can be less that one meter, less than half meter, less than twenty centimeters, less than ten centimeter, less than five centimeter, or even less. Other parts can be less curved, and/or remain planar, e.g. having a radius of curvature R more than one, five, ten meters. The curvature can also extend in different directions. Advantageously, bending the laminate in transverse directions may add to its stiffness. Of course the radius of curvature B can be different in different directions to form convex, concave, or even saddle shaped curvatures.

While the figures show thermoforming with a double mold, also a single mold can be used, e.g. with the outside of the cover substrate 20) on the mold. For example, the pressure is applied with (heated) air (80 bar or similar), instead of a metal mold. All options are possible when a laminate is used. In some embodiments, an opening can be provided in electronics substrate 10, e.g. at a position of the electronics. Optionally, a flap can be provided on an inside of the electronics substrate 10, e.g. against the thermoplastic layer 30. In this way contact can be made from outside to the circuit on the inside. For example, an opening can be kept in the injection molding material 60m for the opening in the electronics substrate 10.

Figure 3A:
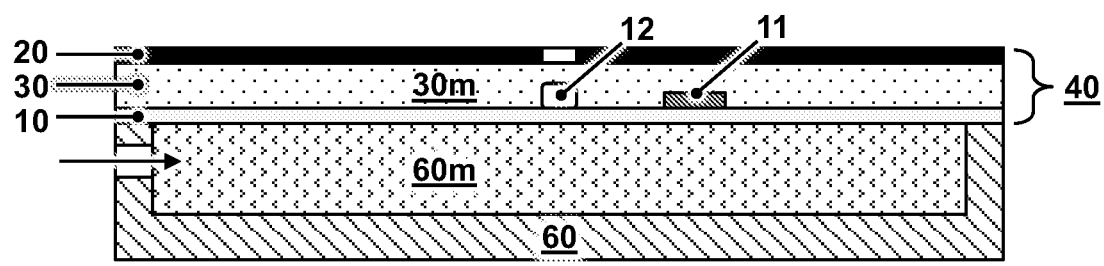
FIGS. 3A and 3B illustrate back injection molding of a multilayer laminate.
Figure 3B:
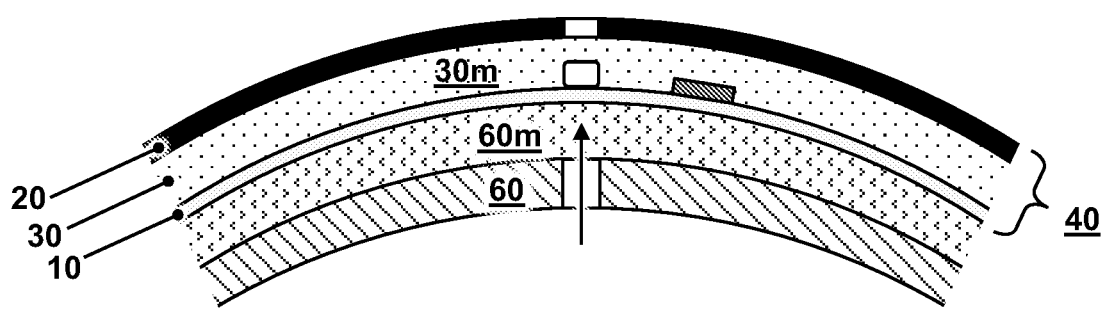

FIGS. 3A and 3B illustrate back injection molding of a multilayer laminate 40. In some embodiments, the thermoformed part has a relatively high stiffness, e.g. wherein the electronic device 100 retains its (3D) shape without further processing. In other or further embodiments, the electronic device 100 is reinforced by further processes, e.g. additional layers or backing. In one embodiment, the multilayer laminate 40 forms part of an at least partially enclosed volume, the method further comprising applying a injection molding process to fill the volume by an injection molding material 60m for reinforcing the multilayer laminate 40. For example, as shown, the injection molding material 60m comprises a thermosetting material. Advantageously, the thermosetting material may have a relatively high melting temperature so it can withstand high temperatures during use without deforming. In a preferred embodiment, the electronics substrate 10 is arranged between the electronic components 11,12 and the injection molding material 60m. It will be appreciated that the injection molding material 60m does not need to directly contact the electronic components 11,12. So overheating of the components during manufacturing may be avoided.

In some embodiments, the electronics substrate 10 is arranged between the thermoplastic material 30m and a backing layer comprising a thermosetting material applied by injection molding. In other or further embodiments, the backing layer follows a shape of the multilayer laminate 40. For example, as shown in the figures, an injection mold shape 60 forms a surface with the same or similar shape as the thermoformed multilayer laminate 40. It can even be envisaged to use the same mold 50 as previously used for the thermoforming process, e.g. placed at a distance from the electronics substrate 10. Alternatively, the backing layers can also have other shapes, e.g. simply filling a hack of the volume formed by the thermoformed multilayer laminate 40.

Figure 4A:
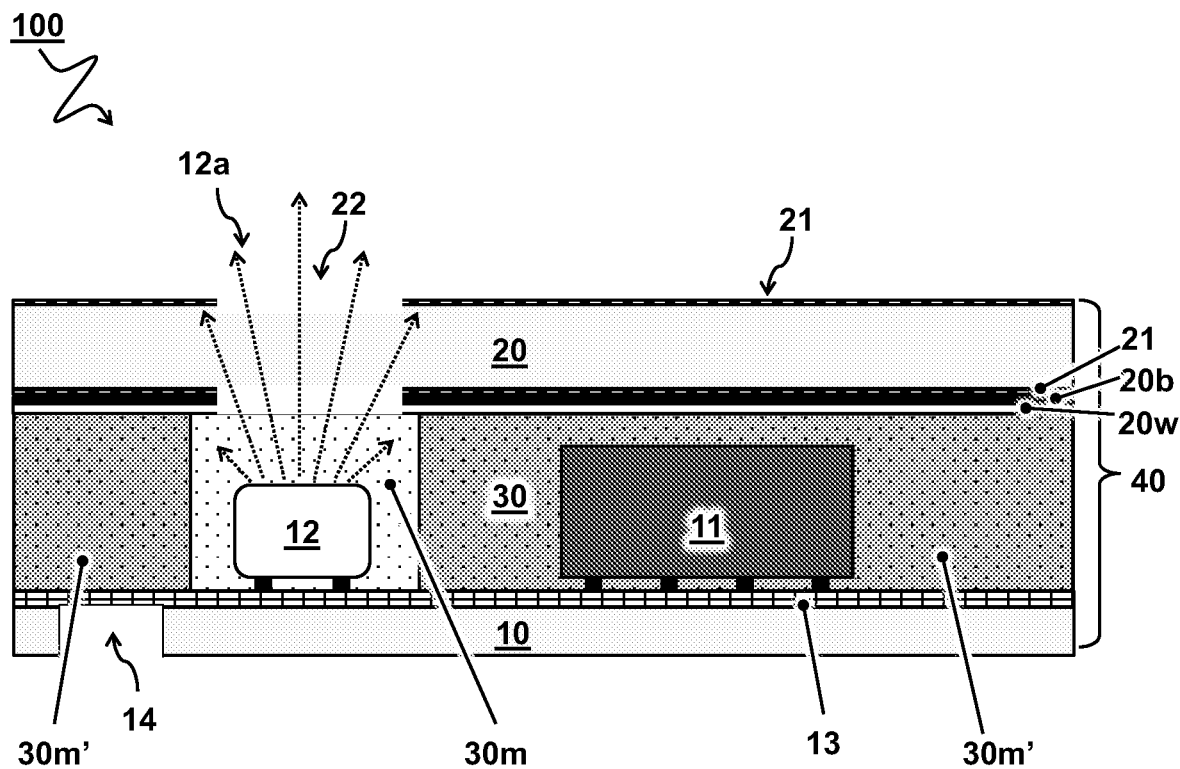
FIGS. 4A and 4B schematically show a cross-section view of an electronic device.
Figure 4B:
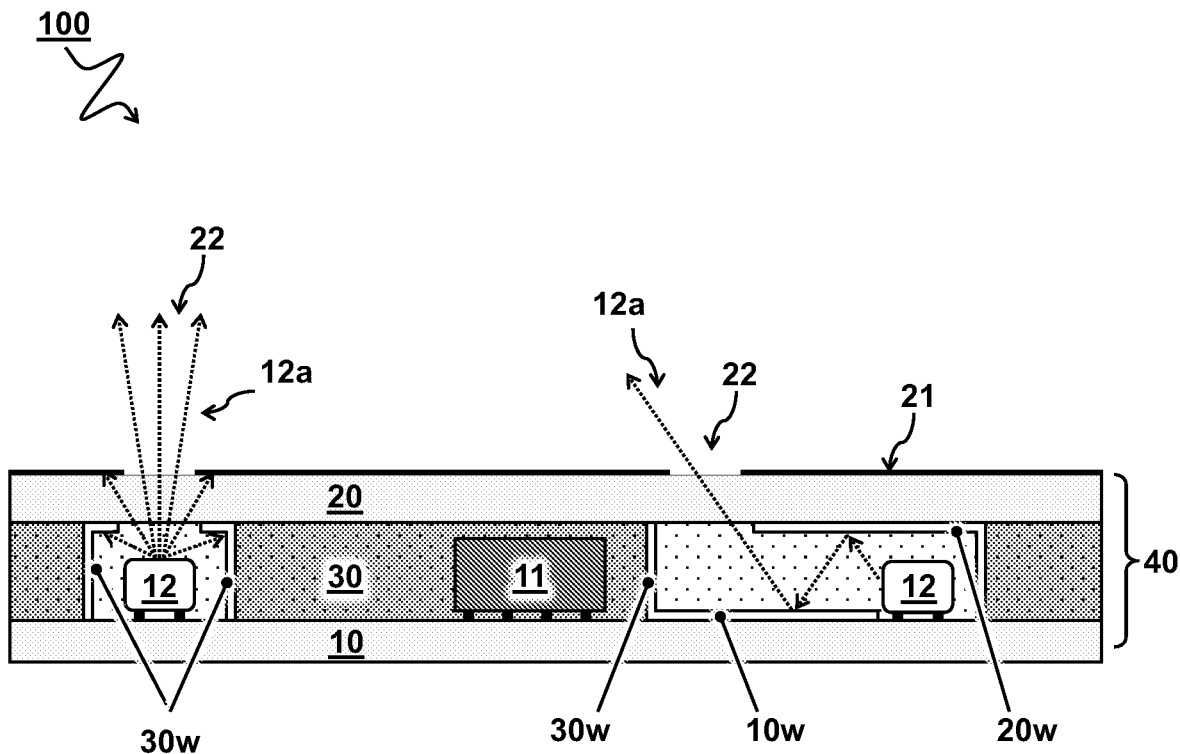

FIGS. 4A and 4B schematically show a cross-section view of an electronic device 100. For example, the figures illustrate preferred embodiments or variations related to the electronics substrate 10, cover substrate 20 and thermoplastic layer 30. In some embodiments, the thermoplastic layer 30 is comprises or essentially consists of a thermoplastic material 30m. Preferably, at least some of the thermoplastic layer 30 has optical properties allowing at least part of the emitted light 12a from the electronics substrate 10 to be transmitted through at least part of the thermoplastic layer 30 to the cover substrate 20. Accordingly, the emitted light 12a can reach a user. For example, at least, part of the thermoplastic layer 30 surrounding the light emitting device 12 is transparent or translucent.

In other or further embodiments, parts of the thermoplastic material 30m', e.g. comprising other, non-light emitting components 11 may be less transparent and/or absorbing for the emitted light 12a. This may reduce a visibility of said other components, e.g. to a user viewing the electronic device 100 from a side of the cover substrate 20. In a preferred embodiment, the thermoplastic layer 30 comprises at least two different types of thermoplastic material 30m. In some embodiments, the thermoplastic layer 30 in a first region comprising the light emitting device 12, comprises a first type of thermoplastic material 30m that is relatively transparent to the emitted light 12a. In other or further embodiments, the thermoplastic layer 30 in a second region not comprising any light emitting device 12, comprises a second type of thermoplastic material 30m' that is relatively opaque to the emitted light 12a, e.g. at least less transparent, than the said first region. For example, the thermoplastic material 30m' in the second region has an absorption coefficient (e.g. to the emitted light or other visible light) that is at least a factor two higher than the thermoplastic material 30m in the first region. In a preferred embodiment, such thermoplastic layer 30 is formed by cutting two or more layers of different thermoplastic material 30m into complementary patterns. For example, this may include a pattern of relatively transparent thermoplastic material 30m to cover the at least one light emitting device 12.

In some embodiments, at least some of the relatively opaque thermoplastic material 30m' can be black, i.e. absorbing most of the light, e.g. to Obscure some of the electronic components 11 from view. In other or further embodiments, at least some of the thermoplastic layer 30 comprises patches of opaque white thermoplastic material 30m' for reflecting the emitted light 12a of the at least one light emitting device 12 towards a respective window 22. Advantageously, when the relatively opaque thermoplastic material 30m' is white (at least surrounding the first region), this may help reflect the emitted light 12a from the light emitting device 12 through the relatively transparent thermoplastic material 30m. Alternatively, or in addition to using reflective thermoplastic material, it, can also be envisaged that a volume of the thermoplastic layer 30 comprising the light emitting device 12 is coated by one or more layer of reflective material 10w,20w,30w.

In some embodiments, e.g. as shown in the top figure, a reflective and/or white layer 20w can be formed between the thermoplastic layer 30 and the cover substrate 20. Optionally, another, e.g. black or other absorbing color layer 20h can be arranged between the reflective and/or white layer 20w, and the cover substrate 20 and/or top side of the device. As will be appreciated, the bottom white/reflective layer 20w may help to reflect the light down (thus improving efficiency) while the top black layer may help to absorb any light being transmitted through the white layer. In other or further embodiments, e.g. as shown in the bottom figure, further layers of reflective material 10w,20w can be applied, e.g. to the electronics substrate 10 and or as part of the thermoplastic layer 30. For example, a light guiding structure can be formed.

In some embodiments, e.g. as shown in the bottom figure, the electronics substrate 10 comprises more than one light emitting device 12. In other or further embodiments, the cover substrate 20 comprises more than one window 22 for transmitting at least part of the emitted light 12a from a respective light emitting devices 12, e.g. one per light emitting device 12. It can also be envisaged to use multiple light emitting devices per window, or multiple windows per light emitting devices (not shown).

In a preferred embodiment, the light emitting device 12 is centered below a respective window 22, at least (partially) overlaps a position of the window 22. For example, the window is configured to transmit more than twenty, thirty, fifty, eighty, ninety, ninety-five, or even more than ninety-nine percent of the emitted light 12a through the window region. In some embodiments, the window comprises color filtering parts, e.g. transmitting specific wavelengths of the emitted light 12a. In other or further embodiments, the electronics substrate 10 comprises one or more at least partially reflective surfaces or material 10m to help with light guiding, e.g. reflecting more than twenty, thirty, fifty, eighty, ninety, ninety-five, or even more than ninety-nine percent of the emitted light 12a. For example, the electronics substrate 10 may comprise patches of white color.

In some embodiments, e.g. as shown, the cover substrate 20 comprises two graphical patterns 21, e.g. one on the outside of the cover substrate 20, and the other on the inside of the cover substrate 20 facing the thermoplastic layer 30. Each of the graphical patterns may comprise one or more layers of (graphical) material. In other or further embodiments, e.g. as shown, the cover substrate 20 comprises one or more layers of white ink 20w and/or black ink 20b.

In some embodiments, e.g. as shown, other variations of the electronics substrate 10 are possible. For example, the electronics substrate 10 comprises an electric circuit line 13. Preferably, the electric circuit lines 13 are flexible. For example, the circuit lines may be printed, e.g. with (flexible) ink. The electronic components 11,12 may be connected to the electric circuit lines 13 on the at least one side of the electronics substrate 10. In other or further embodiments, e.g. as shown, the electronics substrate 10 comprises an interconnect access 14 to electrically access the electric circuit lines 13 from another side of the electronics substrate 10 opposite the side 10a where the electronic components 11,12 protrude from the electronics substrate 10 into the thermoplastic material 30m. For example, the interconnect access 14 can be used to easily connect the electronic components 11,12 to a further circuit or controller, or to perform maintenance of the embedded circuitry. For example, the electric circuit lines 13 can be accessed by the interconnect access 14 by a hole and a wire, or by a vertical interconnect access VIA.

For the purpose of clarity and a concise description, features are described herein as part of the same or separate embodiments, however, it will be appreciated that the scope of the invention may include embodiments having combinations of all or some of the features described. The various elements of the embodiments as discussed and shown offer certain advantages, such as ease of manufacturing, robustness, and low costs. Of course, it is to be appreciated that any one of the above embodiments or processes may be combined with one or more other embodiments or processes to provide even further improvements in finding and matching designs and advantages. It is appreciated that this disclosure offers particular advantages to the design of user interfaces combining light emitting devices arranged as backlighting for front cover graphical patterns, and in general can be applied for any application to protect electronic components between integrated combinations of layers.

In interpreting the appended claims, it should be understood that the word "comprising" does not exclude the presence of other elements or acts than those listed in a given claim; the word "a" or "an" preceding an element does not, exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. Where one claim refers to another claim, this may indicate synergetic advantage achieved by the combination of their respective features. But the mere fact that certain measures are recited in mutually different claims does not indicate that a combination of these measures cannot also be used to advantage. The present embodiments may thus include all working combinations of the claims wherein each claim can in principle refer to any preceding claim unless clearly excluded by context.

The invention claimed is:

1. A method for manufacturing an electronic device, the method comprising:
   providing an electronics substrate comprising electronic components disposed on and protruding from at least one side of the electronics substrate, the electronic components comprising at least one light emitting device for emitting light;
   providing a cover substrate comprising a graphical pattern formed by one or more layers of opaque material, the graphical pattern comprising at least one window for transmitting at least part of the light emitted from a respective light emitting device of the at least one light emitting device;
   providing a thermoplastic layer between the electronics substrate and the cover substrate, the thermoplastic layer comprising a thermoplastic material for transmitting at least part of the light emitted from the respective light emitting device through at least part of the thermoplastic layer; and
   forming a multilayer laminate by combining the electronics substrate and the cover substrate, by a lamination operation, with the electronic components protruding from the electronics substrate facing the thermoplastic layer there between,
   wherein at least the thermoplastic layer is heated to a lamination temperature for increasing a plasticity of the thermoplastic material, and
   wherein the electronic components are pushed, during the lamination operation, into the heated thermoplastic layer and thereby embedding the electronic components in the thermoplastic material.

2. The method according to claim 1, wherein the lamination temperature is:
   above a glass transition temperature of the thermoplastic material, and
   below a glass transition temperature of the electronics substrate and/or the cover substrate.

3. The method according to claim 1, wherein the electronics substrate, the cover substrate, and the thermoplastic layer are initially laminated to form a planar multilayer laminate, and
   wherein the planar multilayer laminate is deformed out-of-plane by a subsequent thermoforming process.

4. The method according to claim 1, wherein the multilayer laminate is heated in a thermoforming process to a thermoforming temperature above a glass transition temperature of the electronics substrate and the cover substrate.

5. The method according to claim 1, wherein the multilayer laminate forms part of an enclosed volume, and
   wherein the method further comprises performing an injection molding process to fill the enclosed volume with an injection molding material thereby reinforcing the multilayer laminate.

6. The method according to claim 1, wherein the electronics substrate is arranged between the thermoplastic material and a backing layer comprising thermosetting material that is applied by injection molding.

7. The method according to claim 1, wherein the thermoplastic layer comprises patches of opaque white thermoplastic material that reflect the emitted light of the at least one light emitting device towards a respective window of the at least one window.

8. The method according to claim 1, wherein a volume of the thermoplastic layer comprising the light emitting device is coated by one or more layers of reflective material.

9. The method according to claim 1, wherein the cover substrate comprises a white layer and a black layer, wherein the white layer is arranged between the electronics substrate and the black layer.

10. The method according to claim 1, wherein the electronics substrate comprises an interconnect access to provide electrical access to an electric circuit line connected to the electronic components from another side of the electronics substrate that is opposite a side from which the electronic components protrude from the electronics substrate and into the thermoplastic material.

11. The method according to claim 1, wherein the thermoplastic layer comprises at least two different types of thermoplastic material, wherein the thermoplastic layer in a first region comprising the light emitting device, comprises a first type of thermoplastic material that is relatively transparent to the emitted light, and
wherein the thermoplastic layer, in a second region not comprising any light emitting device, comprises a second type of thermoplastic material that is relatively opaque.

12. The method according to claim 1, wherein the thermoplastic layer is formed by cutting two or more layers of different thermoplastic material into complementary patterns, including a pattern of relatively transparent thermoplastic material that covers the at least one light emitting device.

13. An electronic device comprising:
an electronics substrate comprising electronic components disposed on and protruding from at least one side of the electronics substrate, the electronic components comprising at least one light emitting device for emitting light;
a cover substrate comprising a graphical pattern formed by one or more layers of opaque material, the graphical pattern comprising at least one window for transmitting at least part of the light emitted from a respective light emitting device of the at least one light emitting device;
a thermoplastic layer between the electronics substrate and the cover substrate, the thermoplastic layer comprising a thermoplastic material for transmitting at least part of the light emitted from the respective light emitting device through at least part of the thermoplastic layer; and
a multilayer laminate formed by combining the electronics substrate and the cover substrate by a lamination operation, at an elevated lamination temperature, to temporarily increase a plasticity of the thermoplastic material, wherein the electronic components have been pushed by the lamination into the heated thermoplastic layer with the electronic components protruding from the electronics substrate facing the thermoplastic layer there between;
wherein the electronic components are embedded in the thermoplastic material.

14. The device according to claim 13, wherein the multilayer laminate has an out-of-plane shape.

15. The device according to claim 13, wherein the electronics substrate is arranged between the thermoplastic material and an injection molded thermosetting material.

16. The method of claim 1, wherein pushing the electronic components, during the lamination operation, into the heated thermoplastic layer for embedding the electronic components in the thermoplastic material pushes away part of the thermoplastic material in the heated thermoplastic layer while the thermoplastic material is softened by the elevated temperature of the thermoplastic layer.

17. The method of claim 16, wherein the electronic components push away some of the thermoplastic material while sinking into the thermoplastic material.

18. The method of claim 17, wherein, by sinking into the thermoplastic material, the electronic components become enveloped or engulfed in the thermoplastic material.

19. The device according to claim 13, wherein the electronic components are sunk into the thermoplastic material, wherein the electronic components have pushed away at least some of the thermoplastic material while sinking into the thermoplastic material.

20. The device according to claim 19, wherein the electronic components, sunk into the thermoplastic material, are enveloped or engulfed in the thermoplastic material.

* * * * *